US008866152B2

(12) United States Patent
Lal et al.

(10) Patent No.: US 8,866,152 B2
(45) Date of Patent: Oct. 21, 2014

(54) BETAVOLTAIC APPARATUS AND METHOD

(75) Inventors: Amit Lal, Ithaca, NY (US); Steven Tin, Plymouth, MN (US)

(73) Assignee: Cornell University, Ithaca, NY (US)

( * ) Notice: Subject to any disclaimer, the term of this patent is extended or adjusted under 35 U.S.C. 154(b) by 57 days.

(21) Appl. No.: 13/510,641

(22) PCT Filed: Nov. 19, 2010

(86) PCT No.: PCT/US2010/057422

§ 371 (c)(1), (2), (4) Date: May 18, 2012

(87) PCT Pub. No.: WO2011/063228

PCT Pub. Date: May 26, 2011

(65) Prior Publication Data

US 2012/0326164 A1 Dec. 27, 2012

Related U.S. Application Data

(60) Provisional application No. 61/262,672, filed on Nov. 19, 2009.

(51) Int. Cl.
*H01L 29/15* (2006.01)
*G21H 1/06* (2006.01)

(52) U.S. Cl.
CPC .................................... *G21H 1/06* (2013.01)
USPC ............................ 257/77; 438/478; 438/109

(58) Field of Classification Search
USPC .................. 257/77, 429, E29.166, E29.104, 257/E21.499, E21.09
See application file for complete search history.

(56) References Cited

U.S. PATENT DOCUMENTS

| | | | | |
|---|---|---|---|---|
| 5,859,484 | A * | 1/1999 | Mannik et al. | 310/303 |
| 8,134,216 | B2 * | 3/2012 | Spencer et al. | 257/428 |
| 8,487,507 | B1 * | 7/2013 | Cabauy et al. | 310/303 |
| 2010/0037937 | A1 * | 2/2010 | Sater | 136/249 |
| 2010/0123084 | A1 * | 5/2010 | Fox et al. | 250/370.14 |
| 2011/0241144 | A1 * | 10/2011 | Spencer et al. | 257/429 |
| 2012/0133244 | A1 * | 5/2012 | Spencer et al. | 310/303 |

OTHER PUBLICATIONS

Authorized Officer; PCT Notification of Transmittal of the International Search Report and the Written Opinion of the International Searching Authority, or the Declaration; Korean Intellectual Property Office; Aug. 31, 2011.

Sun et al.; A Three-Dimensional Porous Silicon p-n Diode for Betavoltaics and Photovoltaics; Advance Materials; 2005 WILEY-VCH Verlag GmbH & Co. KGaA, Weinheim; 17, 1230-1233.

* cited by examiner

*Primary Examiner* — Bilkis Jahan

(74) *Attorney, Agent, or Firm* — William Greener; Bond, Schoeneck & King, PLLC

(57) ABSTRACT

An exemplary thinned-down betavoltaic device includes an N+ doped silicon carbide (SiC) substrate having a thickness between about 3 to 50 microns, an electrically conductive layer disposed immediately adjacent the bottom surface of the SiC substrate; an N− doped SiC epitaxial layer disposed immediately adjacent the top surface of the SiC substrate, a P+ doped SiC epitaxial layer disposed immediately adjacent the top surface of the N− doped SiC epitaxial layer, an ohmic conductive layer disposed immediately adjacent the top surface of the P+ doped SiC epitaxial layer, and a radioisotope layer disposed immediately adjacent the top surface of the ohmic conductive layer. The radioisotope layer can be $^{63}$Ni, $^{147}$Pm, or $^{3}$H. Devices can be stacked in parallel or series. Methods of making the devices are disclosed.

50 Claims, 7 Drawing Sheets

BETAVOLTAIC APPARATUS AND METHOD

CROSS-REFERENCE TO RELATED APPLICATIONS

This application claims priority to U.S. provisional Patent Application Ser. No. 61/262,672 filed on Nov. 19, 2009, the content of which is incorporated herein by reference in its entirety.

FEDERALLY SPONSORED RESEARCH

This invention was made with government support under Project ID Nos. W31P4Q-04-1-R002 and ND N66001-07-1-2019 awarded by DARPA. The United States government has certain rights in the invention.

BACKGROUND OF THE INVENTION

1. Field of the Invention

Embodiments of the present invention relate generally to the field of betavoltaics; more particularly to a semiconductor-betavoltaic apparatus, method of fabrication, and applications thereof; and, more particularly to a silicon carbide (SiC) betavoltaic apparatus, method of fabrication, and applications thereof.

2. Technical Background

A betavoltaic battery consists of a semiconductor diode that is exposed to electrons emitted from a beta-emitting radioisotope thin film. The electrons penetrate the semiconductor material and generate electron-hole pairs by different ionization processes, which are collected across a built-in depletion layer electric field leading to current output with net power. Since the electrons are absorbed within a small absorption depth of only a few microns, a sufficiently large surface area of the exposed semiconductors is required, while maintaining high collection efficiency, to achieve high output electrical energy densities.

With very high energy densities of 1-10 mJ/cc (compared to 1-20 kJ/cc for conventional electrochemical and hydrocarbon fuels), and a long half-life of 1-100 years, radioisotope fueled batteries are ideal for applications requiring compact, long lifetime power supplies, such as remote sensing and implantable devices. Furthermore, low energy $\beta$ emitters ($^{63}$Ni, $^{147}$Pm, $^{3}$H, etc.) have little or no safety concerns, and Promethium-147 powered betavoltaics have been implanted inside humans for powering cardiac pacemakers in the past.

To achieve compact radioisotope batteries, the power density of the device should be as high as possible. The power output density of a betavoltaic battery can be expressed as follows:

$$P_{out}=P_{fuel}\mathrm{FFF}\eta_{fuel}\eta_{\beta} \quad (1)$$

where $P_{fuel}$ is the fuel power density, FFF is the fuel fill factor (volume percentage of the radioisotope fuel), $\eta_{fuel}$ is radioisotope thin-film emission efficiency, and $\eta_{\beta}$ is betavoltaic conversion efficiency. $P_{fuel}$ and $\eta_{fuel}$ are determined by the radioisotope material. Higher energy $\beta$-emitting isotopes such as $^{137}$Cs and $^{90}$Sr have higher fuel power densities due to their high energy, but because these fuels emit very high electrons and significant x-ray flux, packaging volume increases significantly as shielding is needed, which decreases the overall power density of the battery. $^{63}$Ni emits $\beta$-particles with an average kinetic energy of 17.3 keV, with a penetration depth of less than 10 μm in most solids. As a result, devices powered by $^{63}$Ni thin-films, for example, can be deployed safely with millimeter or even microscale shields.

Different techniques of improving the FFF of a betavoltaic battery by patterning and etching of its active device layers have been previously reported; however, in all reported cases, the leakage currents were significantly increased due to the damage to the semiconductor materials in the etching process. Hence very low conversion efficiencies have been experimentally reported, and overall power density has seen little or no improvement in actual devices made so far.

The thicknesses of commercially available semiconductor (including but not limited to SiC and Si) wafers typically range from around 150 μm to 500 μm, where only the top approximately 20 μm is the active functioning region for a betavoltaic battery. Therefore, conventional planar betavoltaics may waste over 90% of their volume. Furthermore, in a planar device 50% of all of the electrons irradiated away from substrate are wasted.

The inventors have recognized the advantages and benefits of a betavoltaic device and associated fabrication methods that overcome the shortcomings and disadvantages recited above, as well as others known in the art.

SUMMARY

A general embodiment of the invention is directed to a 'very thin' betavoltaic cell, with top and bottom metallization. In an exemplary aspect, SiC wafers are thinned to thicknesses comparable to electron absorption depths, for maximizing efficiency. It should be noted, however, that any semiconducting material that can sustain a depletion layer (including, e.g., but not limited to Si, GaN, InN, BN) may be used as a substrate material for the thinned-down betavoltaic device. The embodied architecture allows the radioisotope to be integrated in a planar way. According to an aspect, multiple very thin betavoltaic cells can be cascaded in parallel or series to generate higher voltage and power density such that once cascaded, very high fuel-fill efficiencies are possible.

According to an exemplary embodiment, a betavoltaic device includes an N+ doped silicon carbide (SiC) substrate having a top surface and a bottom surface and a thickness $t_{N+}$, between the top and bottom surfaces, where $t_{N+}$ is equal to or less than about 100 micrometers (μm); an electrically conductive layer disposed immediately adjacent the bottom surface of the SiC substrate; an N− doped SiC epitaxial layer having a top surface, disposed immediately adjacent the top surface of the SiC substrate; a P+ doped SiC epitaxial layer having a top surface, disposed immediately adjacent the top surface of the N− doped SiC epitaxial layer; an ohmic conductive layer having a top surface, disposed immediately adjacent the top surface of the P+ doped SiC epitaxial layer; and a radioisotope layer disposed immediately adjacent the top surface of the ohmic conductive layer. According to various non-limiting aspects, the radioisotope layer may be $^{63}$Ni, $^{147}$Pm, or $^{3}$H, and have a thickness that is equal to or less than the self-absorption thickness of the radioisotope (e.g., about 2-3 μm for $^{63}$Ni). In an aspect, the P+ doped SiC epitaxial layer has a doping concentration equal to or greater than $10^{19}/cm^3$ and a thickness that is equal to or less than about 250 nm. In an aspect, the N− doped SiC epitaxial layer has a doping concentration equal to or less than about 4.6E14/cm$^3$ and a thickness that is equal to or less than the lesser of the diffusion length of the electron-hole pairs and the penetration depth of incident electrons. In various aspects, the thinned N+ doped silicon carbide (SiC) substrate has a thickness that is between about 2 to 50 μm and more particularly, between about 2 to 30 μm (limited by current wafer thinning technology). The dies may be etched to create individual devices.

Another embodiment of the invention is directed to an electrically series-stacked betavoltaic device. The series-stacked device includes at least two betavoltaic devices as described above and, a positive electrode connected to a top or bottom of the stack and a negative electrode connected to a bottom or top of the stack, respectively. According to an aspect, a low melting temperature conductive adhesion layer of material such as a metal layer, for example, is disposed between the electrically conductive layer of the one betavoltaic device and the radioisotope layer of the other betavoltaic device. When the device is annealed in vacuum at the melting temperature of the adhesion layer, the layer will reflow and hold or bond the stacked devices together. In a non-limiting, exemplary aspect, the adhesion layer is aluminum having a pre-anneal thickness of about 50 nm.

Another embodiment of the invention is directed to an electrically parallel-stacked betavoltaic device. The parallel-stacked device includes at least two of the betavoltaic devices as described above, disposed in an opposing, facing relationship in a parallel stack and, a positive electrode disposed on a side of the stack and connected to the electrically conductive layers in the stack and a negative electrode disposed on the other side of the stack and connected to the ohmic conductive layers of the stack. As in the series-stacked embodiment, the parallel-stacked device may include a low melting temperature conductive adhesion layer disposed between and contacting the electrically conductive layer of the first betavoltaic device and the radioisotope layer of the second betavoltaic device.

A general embodiment of the invention is directed to a process for fabricating a very thin betavoltaic cell and, additionally, for cascading two or more very thin betavoltaic cells, resulting in cells that generate higher voltage and power density.

According to an exemplary embodiment, a method for making a betavoltaic device includes the steps of providing an N+ doped SiC substrate having a thickness that is greater than about 150 μm; providing an N− doped SiC epitaxial layer on a top surface of the substrate; providing a P+ doped epitaxial layer on a top surface of the N− doped SiC epitaxial layer; providing an ohmic conductive layer on a top surface of the P+ doped SiC epitaxial layer; thinning the substrate from a bottom surface thereof to a thickness that is less than about 100 μm; providing an electrically conductive layer on the bottom surface of the thinned substrate; suitably annealing the device; and providing a radioisotope layer on a top surface of the ohmic conductive layer. External electrodes may then also be connected to the device. The device may also be etched to provide individual device isolation. In various aspects, more particular process limitations follow the structural parameters outlined above for the betavoltaic device embodiments.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION OF EXEMPLARY EMBODIMENTS OF THE INVENTION

Reference will now be made in detail to the present exemplary embodiments of the invention, non-limiting examples of which are illustrated in the accompanying drawings. Wherever possible, the same reference numbers will be used throughout the drawings to refer to the same or like parts.

Figure 1:
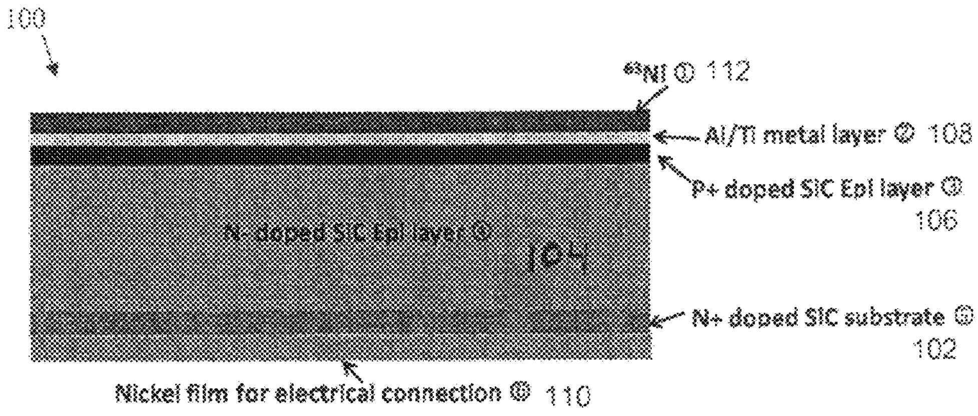
FIG. 1 shows a betavoltaic device according to an embodiment of the invention.

FIG. 1 schematically illustrates a betavoltaic device 100 according to a non-limiting, exemplary embodiment of the invention. Betavoltaic device 100 includes an N+ doped silicon carbide (SiC) substrate 102 having a top surface 103 and a bottom surface 105. The device 100 further includes an N− doped SiC epitaxial layer 104 having a top surface 107, disposed immediately adjacent the top surface 103 of the SiC substrate; a P+ doped SiC epitaxial layer 106 having a top surface 109, disposed immediately adjacent the top surface 107 of the N− doped SiC epitaxial layer; an aluminum/titanium ohmic conductive layer 108 having a top surface 111, disposed immediately adjacent the top surface 109 of the P+ doped SiC epitaxial layer; an electrically conductive layer of Nickel 110 disposed immediately adjacent the bottom surface 105 of the SiC substrate 102; and, a $^{63}$Ni radioisotope layer 112 disposed immediately adjacent the top surface 111 of the ohmic conductive layer.

Description of the Different Layers of the SIC Betavoltaic Device

N+ Doped SiC Substrate 102

The SiC substrate layer 102 provides structural support when the overall thickness of other layers are very thin. It also serves to provide good ohmic contact with the metallized layer(s) with which it is in contact. The defect quality of commercially available, starting N+ doped SiC substrates (typically about 150 to 500 microns thick) is low. The high doping provides a low resistance in series with the diode, while not being used for its diffusion properties. The thickness of the SiC substrate layer 102 advantageously can be between a few (e.g., 2-3) microns to less than about 100 microns. In a particular exemplary aspect, the SiC substrate can be about 50 microns or less, and in another particular exemplary aspect, the SiC substrate can be about 30 microns or less. The SiC substrate can be polished by incorporating the wafers in a wax package.

N− Doped SiC Epitaxial Layer 104

The width of depletion region is inversely proportional to the square root of the $$l_n = \sqrt{\frac{2\varepsilon_s}{q}\frac{\Phi_o N_a}{N_d(N_a+N_d)}}$$

where $l_n$ is the depletion width in the N− doped layer, $\in_s$ is the semiconductor dielectric constant, $\phi_0$ is the build in potential, q is the elementary charge, and $N_a$, $N_d$ are doping levels in the P-doped region and N− doped region, respectively. A wider depletion region is desired because electron-hole pairs generated inside the depletion region are fully utilized for power generation due to the device electric field sweeping the electron-hole pairs to the two sides. The doping in layer 104 is chosen to be low ($4.6\times10^{14}/cm^3$). Low doping results in a longer diffusion length, so electrons and holes can travel further without recombining. The film thickness of this layer is determined by the diffusion length of the electron-hole pairs and the penetration depth of incident electrons, whichever is smaller. If the film thickness is larger than the electron penetration depth, no electron-hole pairs will be generated in the extra thickness. If the film thickness is larger than the electron-hole diffusion length, even if there are electron-hole pairs generated in the extra thickness, they cannot diffuse to the depletion region to contribute to the power generation. For the doping concentration of $4.6\times10^{14}/cm^3$, the diffusion lengths for electrons and holes are over 40 microns, thus the film thickness will be limited by the incident electron penetration depth. For $^{63}Ni$, e.g., the penetration depth is less than 3 um, while electrons from $^{147}Pm$ can, on average, penetrate 20 um. Extra thickness in this layer will add to higher series device resistance and higher cost due to the expense in requiring thicker N− doped epi films.

P+ Doped SiC Epitaxial Layer 106

This layer is heavily doped ($10^{19}/cm^3$) to create a P+-N junction for the betavoltaic device. The epi-layer is grown using a seeded sublimation growth process with aluminum dopant added in the growth process. Comparing to acceptors such as boron and gallium, aluminum has lower ionization energy. The heavy doping also improves the ohmic contact with the metallization layer(s). As electrons pass through this layer, electron-hole pairs are generated. However, due to its high doping, the diffusion lengths of both electrons and holes are very short; together with the extremely small depletion width, most electron-hole pairs generated in this layer are recombined quickly without contributing to the betavoltaic power generation. Therefore, this layer should be as thin as possible while providing a high quality p-n junction. In a prototype device, layer 106 was 250 nm thick.

Ohmic Conductive Layer 108

The ohmic conductive layer 108 provides an ohmic electrical connection between the P+ doped SiC epi layer and the outside electrode. Since electrons need to dissipate energy to get through this layer, it should be as thin as possible while providing good electrical connection. In an exemplary aspect, layer 108 is aluminum/titanium. To achieve ohmic contact with low resistivity in our prototype device, a film with 90 wt % aluminum and 10 wt % titanium was deposited on the P+ doped SiC epi layer and annealed at 1000° C. The film thickness was 250 nm. The Al/Ti layer can be replaced by other suitable metallization layers as understood in the art.

Bottom Metallization Layer 110

Bottom metallization layer 110 provides electrical contact to the N− doped region of the betavoltaic device. The thickness of this layer may advantageously be up to one micron, such that it can provide a good electrical connection without adding excessive dead volume to the device. In our prototype device, bottom metallization layer 110 was chosen to be nickel, as nickel forms a good ohmic contact with N− doped SiC substrates.

Radioisotope Layer 112

Radioisotopes, such as $^{63}Ni$, $^{147}Pm$, and $^{3}H$, for example, can be deposited in a thin film to provide an electron source for the device. The maximum thickness of radioisotope thin film layer 112 is determined by the self-absorption thickness of the radioisotope. If the film thickness is thicker than the self-absorption thickness, the electrons emitted from the extra thickness will be absorbed by the film itself and wasted as heat. For $^{63}Ni$, e.g., the self-absorption thickness is approximately two microns in SiC as calculated from Monte Carlo simulation. The radioisotope layer advantageously is directly in contact with the ohmic conductive layer 108 at all locations, and can be partially in contact with the diode layer.

Figure 2:
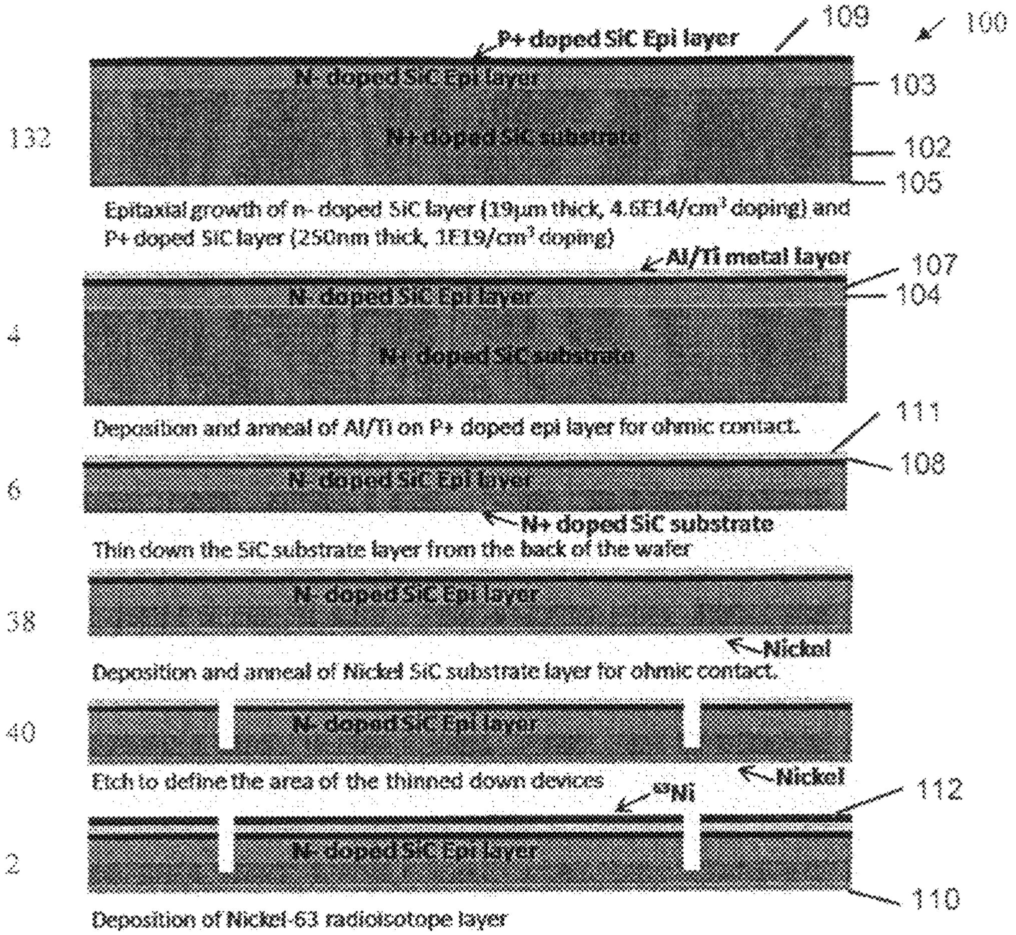
FIG. 2 shows a betavoltaic device manufacturing process diagram according to an embodiment of the invention.

FIG. 2 schematically illustrates the process steps 132-142 for making a betavoltaic device 100 according to an exemplary embodiment of the invention. A commercially available N+ doped SiC substrate 102 was obtained. Since the SiC wafer substrate has too many defects to be the active device layer, a 19 μm thick N− doped ($4.6\times10^{14}/cm^3$) SiC epitaxial layer 104 followed by a 0.25 μm thick P+ doped ($10^{19}/cm^3$) SiC epitaxial layer 106 were grown on the top surface 103 of the substrate as active device layers, as shown at step 132. The N− doped layer 104 was designed to be thick enough to collect most of the radioactive electrons. The P+ doped layer 106 has a much higher doping level than the N− doped layer to create a large voltage across the depletion region.

At step 134, an Al/Ti metal ohmic conductive layer 108 was deposited on a top surface of the P+ doped SiC epitaxial layer and annealed (rapid thermal annealed).

As shown at step 136, the N+ doped SiC substrate 102 was thinned from a bottom surface thereof to a thickness $t_{N+}$ less than about 100 μm. In our prototype device/process, the substrate 102 was thinned from an initial thickness of 280 μm to 50 μm. Thinning to 30 μm or less may be advantageous but limited by the ability to physically thin the substrate in the range of about 3 to 50 μm.

At step 138, an electrically conductive layer 110 of Nickel was deposited on the bottom surface of the thinned substrate and suitably annealed.

At step 140, the device was etched to define the areas of individual devices.

At step 142, a thin film $^{63}Ni$ radioisotope layer 112 was deposited on the top surface of the ohmic conductive layer 108.

Testing and Performance

Figure 3:
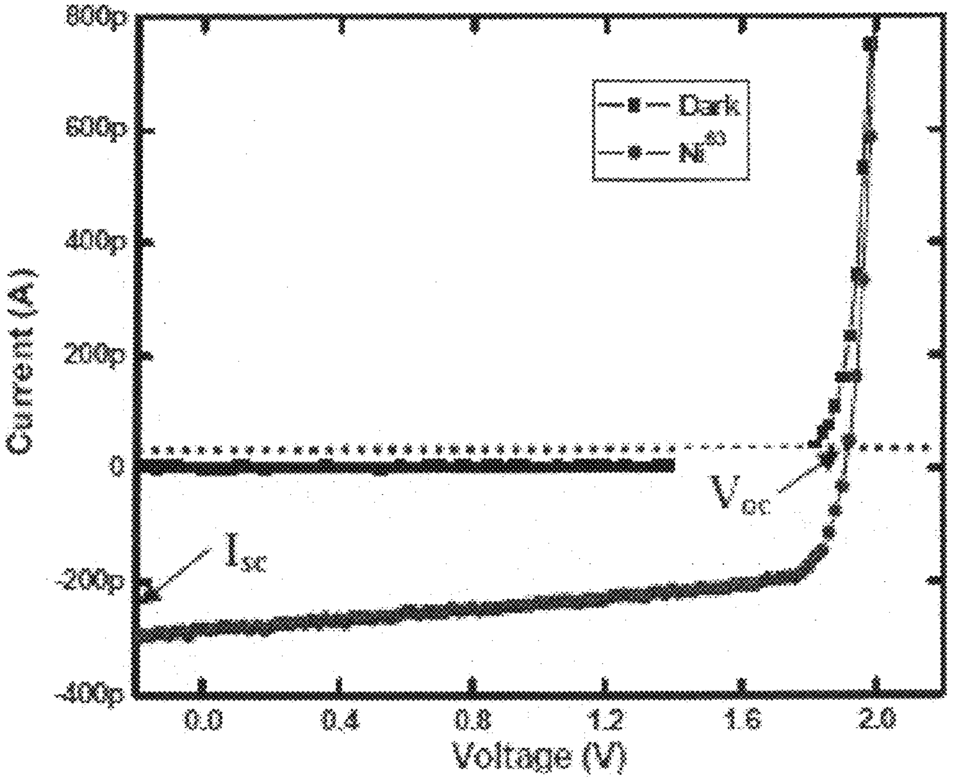
FIG. 3 shows a graph of measured IV characteristic of a regular thickness SiC betavoltaic under $^{63}$Ni electron irradiation.

Energy conversion characteristics of regular thickness SiC betavoltaics were first measured under electron irradiations from a $^{63}Ni$ source, which has a radioactivity of 1.5 $mCi/cm^2$. The I-V curves of a device with 1 mm×1 mm area are plotted in FIG. 3. Under electron irradiation from $^{63}Ni$, the device has a short-circuit current of 300 pA with an open-circuit voltage of 1.9 V. An ultra-high conversion efficiency of 22.3% was achieved (341 nW of output power vs. 1.53 nW of input power at 1.76 V), which is almost four times the previous best results as reported by Chandrashekhar, M. V. S., Thomas, C. I., Li, H., Spencer, M. G., Lal, A., *Demonstration of a 4H SiC betavoltaic cell*, Applied Physics Letters, 91, n 5, 2007, p 053511.

Figure 4:
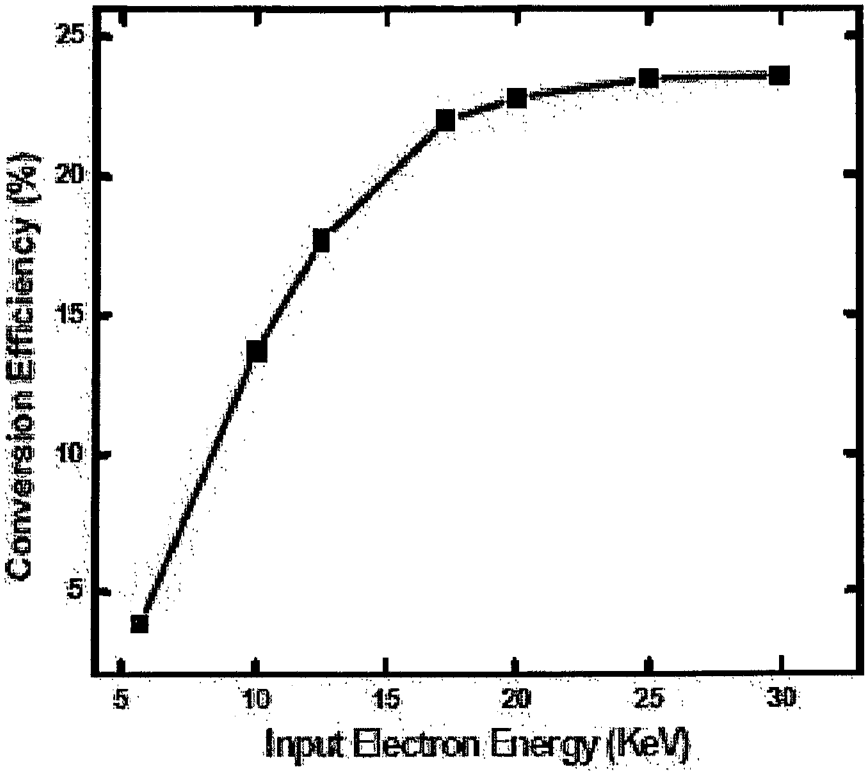
FIG. 4 shows a graph of measured conversion efficiency at different input electron energies for a regular-thickness device.

The betavoltaic devices were further characterized in a scanning electron microscope by irradiating them with 20 pA-2 nA electron beams (corresponding to ~3 mCi to ~300 mCi of radioactivity) accelerated at voltages up to 30 kV (SEM limit). The conversion efficiency of the device was low at low electron energies, as shown in FIG. 4. This was due to the energy loss for electrons to go through the heavily P-doped SiC carbide layer, where the electron-hole pairs generated by the incoming electrons are quickly recombined. As the electron energy increases and more electrons reach the depletion region, the percentage of the energy absorbed without electron-hole pair generation in the P-doped SiC decreases. Therefore, the conversion efficiency increases until it reaches the maximum efficiency for the betavoltaic device, which is 23.6%. Further increases of the electron energy could lead to decreases in the overall conversion efficiency if the electron penetration depth in the SiC is larger than the electron-hole diffusion length in the low N− doped epitaxial layer.

Figure 5:
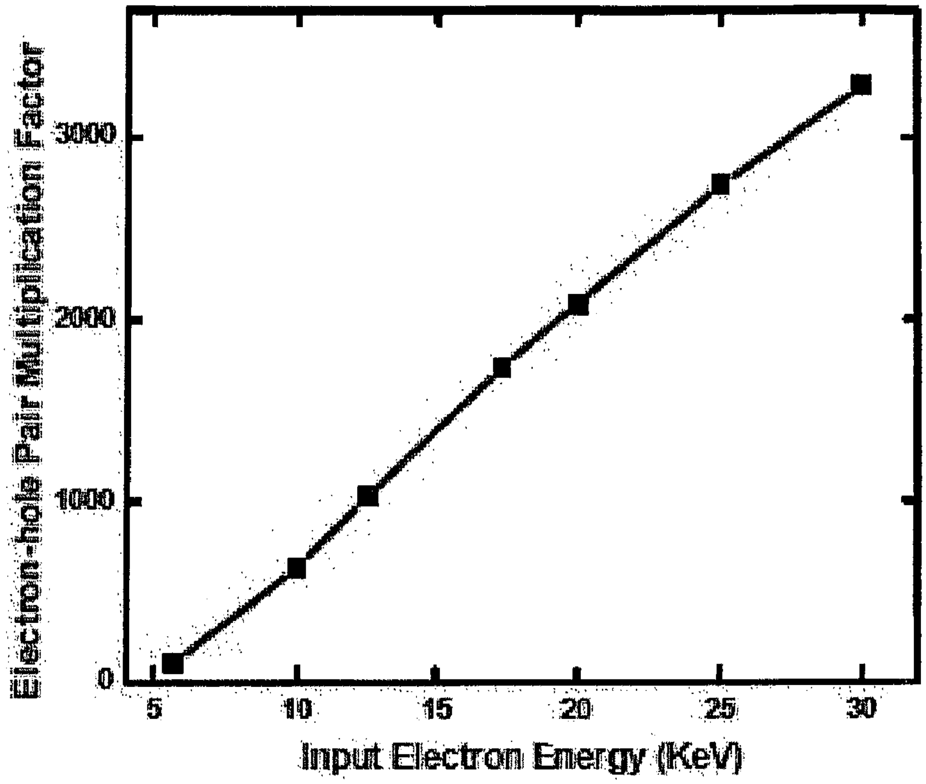
FIG. 5 shows a graph of measured electron-hole pairs multiplication factor at different input electron energies for a regular thickness device.

The electron-hole pair (EHP) multiplication factor (number of EHPs generated per input electron) is plotted in FIG. 5. A near straight line at high energies indicates that the device could work at even higher input electron energy (>30 keV) with the same efficiency. Therefore, $^{147}$Pm, which has a higher average electron energy (62 keV) and higher power density (2.05 W/cc, compared to ~13.4 mW/cc for $^{63}$Ni) could be used as a radioisotope source to further increase the power density of the betavoltaic battery.

To demonstrate the thinned-down betavoltaic device according to the embodied invention, a 1 cm×1 cm, 280 μm-thick SiC betavoltaic die was thinned down to 50 μm from the backside of the substrate. The thinned-down prototype gave a more than 4× improvement on the FFF of the devices.

Figure 6:
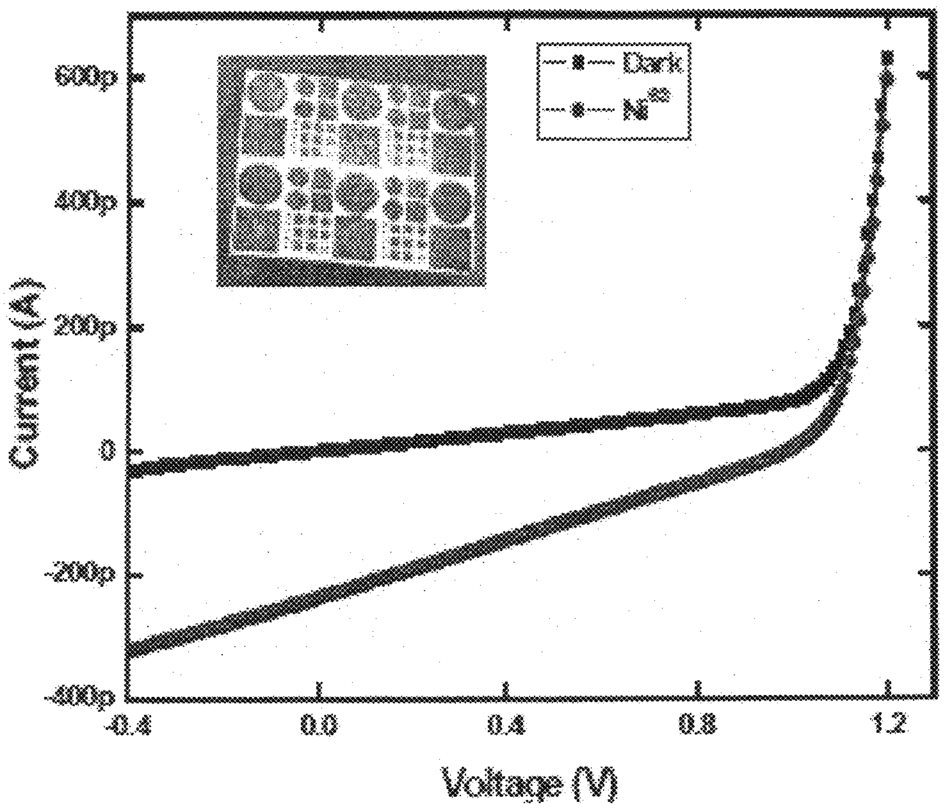
FIG. 6 shows a graph of measured IV characteristic of thinned-down 50 μm thick SiC betavoltaic device under $^{63}$Ni electron irradiation, according to an exemplary embodiment of the invention.

The thickness of the devices could have been further thinned down to 30 μm (limited by the currently available SiC wafer thinning technology), which would provide a FFF improvement of 8×. The thinned-down SiC betavoltaic was tested under $^{63}$Ni irradiation, and an 11.2% conversion efficiency was achieved, as shown in FIG. 6. The reduced efficiency was due to the lack of protection for the P+ doped epitaxial layer in the wafer thinning process. The damage to epitaxial layers causes a higher leakage current, which lowers the open-circuit voltage and the conversion efficiency. With a carrier wafer to protect the epitaxial layers in the wafer-thinning process, a conversion efficiency of 22.3% is expected for the thinned-down SiC betavoltaics with $^{63}$Ni irradiation. A power density increase of 170% was achieved with our prototype device.

Figure 7:
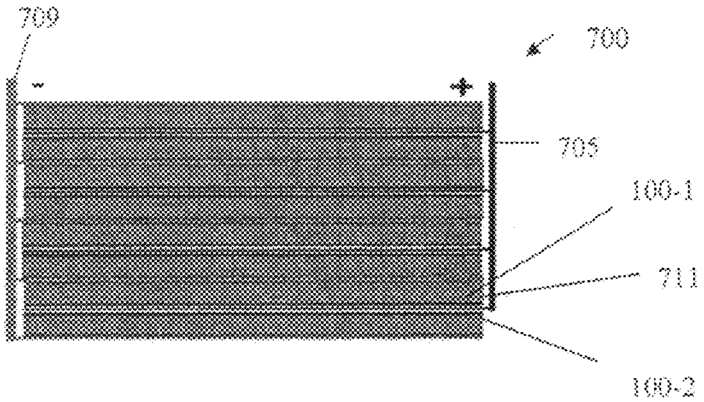
FIG. 7 schematically shows an electrically-parallel stacked betavoltaic device according to an exemplary embodiment of the invention.

FIG. 7 schematically shows an electrically-parallel stacked betavoltaic device 700 according to an exemplary embodiment of the invention. The parallel stacked betavoltaic device 700 is made up of at least two betavoltaic devices 100-1, 100-2 that are disposed in an opposing, facing relationship in a parallel stack. A positive electrode 705 is disposed on a side of the stack and connected to the electrically conductive layers in the stack and a negative electrode 709 is disposed on the other side of the stack and connected to the ohmic conductive layers of the stack. In an exemplary aspect, an adhesion layer 711 is disposed intermediate and contacting the electrically conductive layer of the first betavoltaic device 100-1 and the radioisotope layer of the second betavoltaic device 100-2. The adhesion layer can be a thin (e.g., ~50 nm) layer of low-melting temperature metal such as aluminum that is deposit post annealing. The devices can then be stacked, clamped, and annealed at the melting temperature of the adhesion metal (e.g., 660° C. for Al) in vacuum. The adhesion metal layer will reflow and hold the individual layers together. The metal electrodes 705, 709 are then connected on the top and bottom of the stack for power output.

Figure 8:
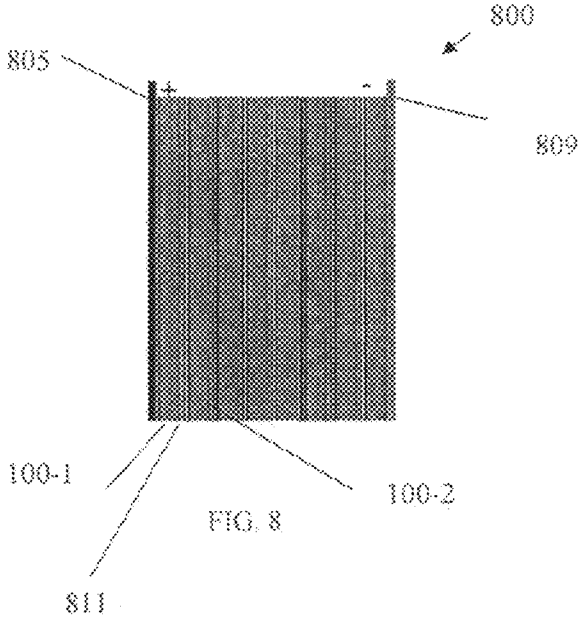
FIG. 8 schematically shows an electrically-series stacked betavoltaic device according to an exemplary embodiment of the invention.

FIG. 8 schematically shows an electrically-series stacked betavoltaic device 800 according to an exemplary embodiment of the invention. The parallel stacked betavoltaic device 800 is made up of at least two betavoltaic devices 100-1, 100-2 that are disposed in a series stack. A positive electrode 805 connected to the top or bottom of the stack and a negative electrode 809 is connected to the bottom or the top of the stack. In an exemplary aspect, an adhesion layer 811 is disposed intermediate and contacting the electrically conductive layer of the first betavoltaic device 100-1 and the radioisotope layer of the second betavoltaic device 100-2. The adhesion layer can be a thin (e.g., ~50 nm) layer of low-melting temperature metal such as aluminum that is deposit post annealing. The devices can then be stacked, clamped, and annealed at the melting temperature of the adhesion metal (e.g., 660° C. for Al) in vacuum. The adhesion metal layer will reflow and hold the individual layers together.

Table 1 presents a table of power density values for various device parameters as listed.

TABLE 1

| | Radioisotope | | | | | | | | |
|---|---|---|---|---|---|---|---|---|---|
| | $^{3}$H | | | $^{63}$Ni | | | $^{147}$Pm | | |
| Power/Curie (μW/Ci) | 29.6 | | | 100.6 | | | 373 | | |
| Specific Power density (mW/cc) | 14.8 | | | 13.4 | | | 1212 | | |
| Film Thickness (μm) | — | | | 2 | | | 10 | | |
| Emission efficiency/side | — | | | 40% | | | 40% | | |
| Radioactivity/area (Ci/cm$^2$) assumption for $^{3}$H only | 0.5 | | | — | | | — | | |
| Power density (mW/cm$^2$) | 0.015 | | | 0.0011 | | | 0.48 | | |
| Betavoltaic Efficiency | 23.6% | | | 23.6% | | | 23.6% | | |
| Power output/layer (mW/layer) | 0.0035 | | | 2.6E−4 | | | 0.11 | | |
| Layer thickness (μm) | 30 | 50 | 300 | 30 | 50 | 300 | 30 | 50 | 300 |
| Power Density (mW/cc) | 1.15 | 0.7 | 0.11 | 0.08 | 0.05 | 0.008 | 36 | 22 | 3.6 |

Although the exemplary embodiments and aspects of the invention were described for SiC, a person skilled in the art could fabricate a betavoltaic device according to the embodied invention using any semiconductor material that can sustain a depletion region, including adjusting doping concentrations appropriately.

All references, including publications, patent applications, and patents cited herein are hereby incorporated by reference in their entireties to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

We claim:

1. A betavoltaic device, comprising:

an N+ doped semiconductor substrate having a top surface and a bottom surface and a thickness $t_{N+}$ between the top and bottom surfaces, where $t_{N+}$ is equal to or less than 100 micrometers (μm);

an electrically conductive layer disposed immediately adjacent the bottom surface of the substrate;

an N− doped epitaxial layer having a top surface, disposed immediately adjacent the top surface of the substrate;

a P+ doped epitaxial layer having a top surface, disposed immediately adjacent the top surface of the N− doped epitaxial layer;

an ohmic conductive layer having a top surface, disposed immediately adjacent the top surface of the P+ doped epitaxial layer; and a radioisotope layer disposed immediately adjacent the top surface of the ohmic conductive layer, wherein coincident regions of at least a portion of the radioisotope layer, the second electrically conductive layer, the P+ doped epitaxial layer, and the N− doped epitaxial layer, and the N+ doped substrate are etched so as to provide a plurality of devices including a common N+ doped substrate and first electrically conductive layer.

2. The betavoltaic device of claim 1, wherein the N+ doped semiconductor substrate is silicon carbide (SiC).

3. The betavoltaic device of claim 1, wherein the radioisotope layer is $^{63}$Ni.

4. The betavoltaic device of claim 1, wherein the radioisotope layer is $^{147}$Pm.

5. The betavoltaic device of claim 1, wherein the radioisotope layer is $^{3}$H.

6. The betavoltaic device of claim 1, wherein the radioisotope layer has a thickness, $t_{Rad}$, where $t_{Rad}$ is equal to or less than the self-absorption thickness of the radioisotope.

7. The betavoltaic device of claim 3, wherein the radioisotope layer has a thickness, $t_{Rad}$, where $t_{Rad}$ is equal to or less than about two micrometers.

8. The betavoltaic device of claim 2, wherein the ohmic conductive layer is an aluminum/titanium layer having a thickness $t_{ohm}$, where $t_{ohm}$ is equal to about 250 nanometers (nm).

9. The betavoltaic device of claim 8, wherein the aluminum/titanium layer is 90 wt. % Al and 10 wt. % Ti.

10. The betavoltaic device of claim 2, wherein the P+ doped epitaxial layer has a doping concentration equal to or greater than $10^{19}/cm^3$.

11. The betavoltaic device of claim 2, wherein the P+ doped epitaxial layer has a thickness $t_{P+}$, where $t_{P+}$ is equal to or less than 250 nm.

12. The betavoltaic device of claim 2, wherein the N− doped epitaxial layer has a doping concentration equal to or less than 4.6E14/$cm^3$.

13. The betavoltaic device of claim 1, wherein the N− doped epitaxial layer has a thickness $t_{N-}$, where $t_{N-}$ is equal to or less than the lesser of the diffusion length of the electron-hole pairs and the penetration depth of incident electrons.

14. The betavoltaic device of claim 13, wherein the radioisotope layer is $^{63}$Ni and further wherein $t_{N-}$ is less than 3 μm.

15. The betavoltaic device of claim 13, wherein the radioisotope layer is $^{147}$Pm and further wherein $t_{N-}$ is equal to or less than 20 μm.

16. The betavoltaic device of claim 1, wherein $2 \leq t_{N+} \leq 50$ μm.

17. The betavoltaic device of claim 16, wherein $30 \leq t_{N+} < 50$ μm.

18. The betavoltaic device of claim 1, wherein the electrically conductive layer has a thickness $t_{ec}$, where $t_{ec}$ is equal to or less than 1 μm.

19. The betavoltaic device of claim 2, wherein the electrically conductive layer is nickel.

20. A betavoltaic device, comprising:

at least a first and a second of the betavoltaic devices according to claim 1, wherein the at least a first and a second of the betavoltaic devices are disposed in a series stack; and a positive electrode connected to one of a top and a bottom of the stack and a negative electrode connected to one of the bottom and the top of the stack.

21. The betavoltaic device of claim 20, wherein the N+ doped semiconductor substrate is silicon carbide (SiC).

22. The betavoltaic device of claim 20, further comprising an adhesion layer disposed intermediate and contacting the electrically conductive layer of the first betavoltaic device and the radioisotope layer of the second betavoltaic device.

23. The betavoltaic device of claim 22, wherein the adhesion layer is metal.

24. The betavoltaic device of claim 23, wherein the adhesion layer is aluminum.

25. The betavoltaic device of claim 24, wherein the aluminum adhesion layer has a pre-annealing thickness of about 50 nm.

26. A betavoltaic device, comprising:

at least a first and a second of the betavoltaic devices according to claim 1, wherein the at least the first and the second of the betavoltaic devices are disposed in an opposing, facing relationship in a parallel stack; and a positive electrode disposed on a side of the stack and connected to the electrically conductive layers in the stack and a negative electrode disposed on the other side of the stack and connected to the ohmic conductive layers of the stack.

27. The betavoltaic device of claim 26, wherein the N+ doped semiconductor substrate is silicon carbide (SiC).

28. The betavoltaic device of claim 26, further comprising an adhesion layer disposed intermediate and contacting the electrically conductive layer of the first betavoltaic device and the radioisotope layer of the second betavoltaic device.

29. The betavoltaic device of claim 28, wherein the adhesion layer is metal.

30. The betavoltaic device of claim 29, wherein the adhesion layer is aluminum.

31. The betavoltaic device of claim 30, wherein the aluminum adhesion layer has a pre-annealing thickness of about 50 nm.

32. A method of making a series-type betavoltaic device, comprising:

providing at least a first and a second of the betavoltaic devices according to claim 1;

providing a connecting layer intermediate to and contacting the electrically conductive layer of the first betavoltaic device and the radioisotope layer of the second betavoltaic device;

stacking the at least first and second betavoltaic devices and the intermediate connecting layer in series;

annealing the device at or above the melting temperature of the connecting layer; and providing a positive and a negative electrode for the device at opposite surfaces, respectively.

33. The method of claim 32, wherein the step of providing an N+ doped semiconductor substrate further comprises providing an N+ doped silicon carbide (SiC) substrate.

34. A method of making a series-type betavoltaic device, comprising:

providing at least a first and a second of the betavoltaic devices according to claim 1 in an opposing, facing relationship;

providing a connecting layer intermediate to and contacting the electrically conductive layer of the first betavoltaic device and the radioisotope layer of the second betavoltaic device;

stacking the at least first and second betavoltaic devices and the intermediate connecting layer in parallel;

annealing the device at or above the melting temperature of the connecting layer; and providing a positive electrode on a side of the stack connected to the electrically conductive layers in the stack and a negative electrode on the other side of the stack connected to the ohmic conductive layers of the stack.

35. The method of claim 34, wherein the step of providing an N+ doped semiconductor substrate further comprises providing an N+ doped silicon carbide (SiC) substrate.

36. A method for making a betavoltaic device, comprising:

providing an N+ doped substrate having a thickness that is greater than about 100 μm;

providing an N− doped epitaxial layer on a top surface of the substrate;

providing a P+ doped epitaxial layer on a top surface of the N− doped epitaxial layer;

providing an ohmic conductive layer on a top surface of the P+ doped epitaxial layer;

thinning the substrate from a bottom surface thereof to a thickness $t_{N+}$ that is equal to or less than 100 μm;

providing an electrically conductive layer on the bottom surface of the thinned substrate;

suitably annealing the device;

providing a radioisotope layer on a top surface of the ohmic conductive layer; and etching coincident regions of at least a portion of the radioisotope layer, the second electrically conductive layer, the P+ doped epitaxial layer, N− doped epitaxial layer, and the N+ doped substrate so as to provide a plurality of devices including a common N+ doped substrate and first electrically conductive layer.

37. The method of claim 36, wherein the step of providing an N+ doped semiconductor substrate further comprises providing an N+ doped silicon carbide (SiC) substrate.

38. The method of claim 36, further comprising providing external electrodes for the device.

39. The method of claim 36, further comprising etching the device to provide individual device isolation.

40. The method of claim 36, wherein the step of providing a radioisotope layer further comprises providing a layer of at least one of $^{63}$Ni, and $^{3}$H.

41. The method of claim 36, wherein the step of providing a radioisotope layer further comprises providing the layer having a thickness $t_{Rad}$ that is equal to or less than the self-absorption thickness of the radioisotope.

42. The method of claim 36, wherein the step of providing an ohmic conductive layer comprises providing a suitable metallization layer.

43. The method of claim 37, wherein the step of providing the P+ doped epitaxial layer further comprises providing the layer with a doping concentration equal to or greater than $10^{19}/cm^3$.

44. The method of claim 43, further comprising providing the P+ doped epitaxial layer having a thickness equal to or less than about 250 nm.

45. The method of claim 37, wherein the step of providing the N− doped epitaxial layer further comprises providing the layer with a doping concentration equal to or less than $4.6E14/cm^3$.

46. The method of claim 45, further comprising providing the N− doped epitaxial layer having a thickness $t_{N-}$ that is equal to or less than the lesser of the diffusion length of the electron-hole pairs and the penetration depth of incident electrons.

47. The method of claim 36, wherein the step of thinning the substrate further comprises thinning the substrate to a thickness $t_{N+}$, that is between about 3 to 50 μm.

48. The method of claim 36, wherein the step of thinning the substrate further comprises thinning the substrate to a thickness $t_{N+}$ that is between about 3 to 30 μm.

49. The method of claim 36, wherein the step of providing an electrically conductive layer further comprises providing the electrically conductive layer having a thickness equal to or less than about 1 μm.

50. The method of claim 37, further comprising providing a layer of Nickel.

* * * * *